United States Patent [19]

Wolfrum et al.

[11] 4,360,840

[45] Nov. 23, 1982

[54] REAL TIME DATA COMPRESSION/DECOMPRESSION SCHEME FOR FACSIMILE TRANSMISSION SYSTEM

[75] Inventors: Larry M. Wolfrum, Chicago; Frederick C. Barrett, Vernon Hills, both of Ill.

[73] Assignee: AM International, Inc., Chicago, Ill.

[21] Appl. No.: 149,362

[22] Filed: May 13, 1980

[51] Int. Cl.$^3$ .......................... H04N 1/40; H04N 7/12
[52] U.S. Cl. .............................. 358/261; 340/347 DD
[58] Field of Search ............................... 358/261, 260; 340/347 DD

[56] References Cited

U.S. PATENT DOCUMENTS

| | | | |
|---|---|---|---|
| 3,560,639 | 2/1971 | Centanni | 358/261 |
| 3,849,592 | 11/1974 | Rosenheck | 358/261 |
| 4,121,259 | 10/1978 | Preus | 358/261 |
| 4,136,363 | 1/1979 | Saran | 358/261 |
| 4,156,880 | 5/1979 | Yamada | 358/261 |
| 4,207,599 | 6/1980 | Murayama | 358/261 |

*Primary Examiner*—Howard Britton
*Attorney, Agent, or Firm*—Anthony W. Karambelas; Robert C. Curfiss

[57] ABSTRACT

A graphic image represented by a two-level pel-to-pel definition is compressed by one-dimensional redundancy reduction coding using an entropy preserving algorithm which allows for real time reduction of the pel-to-pel data without any loss in image resolution. The compressed data is concatenated for transmission and then separated and decoded back to a pel-to-pel format for defining a facsimile image.

18 Claims, 11 Drawing Figures

| CODEWORD | | RUN LENGTH WHITE | RUN LENGTH BLACK |
|---|---|---|---|
| PREFIX (P) | INFORMATION FIELD (N) | | |
| | 10 | 253+ | 1 |
| | 11 | 1 | 2 |
| 0 | 100 | 2 | 3 |
| 0 | 101 | 3 | 4 |
| 0 | 110 | 4 | 5 |
| 0 | 111 | 5 | 6 |
| 00 | 1000 | 6 | 7 |
| 00 | 1001 | 7 | 8 |
| 00 | 1010 | 8 | 9 |
| 00 | 1011 | 9 | 10 |
| 00 | 1100 | 10 | 11 |
| 00 | 1101 | 11 | 12 |
| 00 | 1110 | 12 | 13 |
| 00 | 1111 | 13 | 14 |
| 000 | 10000 | 14 | 15 |
| 000 | 10001 | 15 | 16 |
| 000 | 10010 | 16 | 17 |
| 000 | 10011 | 17 | 18 |
| 000 | 10100 | 18 | 19 |
| 000 | 10101 | 19 | 20 |
| 000 | 10110 | 20 | 21 |
| 000 | 10111 | 21 | 22 |
| 000 | 11000 | 22 | 23 |
| ⋮ | ⋮ | ⋮ | ⋮ |
| 000000 | 1111011 | 249 | 250 |
| 000000 | 1111100 | 250 | 251 |
| 000000 | 1111101 | 251 | 252 |
| 000000 | 1111110 | 252 | 253 |
| 000000 | 1111111 | 253 | 253+ |
| 000····0000 | | LINE SYNC (END OF LINE)* | |

\* 2 CONSECUTIVE LINE SYNC SIGNALS DEFINE END OF PAGE

FIG. 2

| CODEWORD | | RUN LENGTH WHITE | RUN LENGTH BLACK |
|---|---|---|---|
| PREFIX (P) | INFORMATION FIELD (N) | | |
| | 10 | 253+ | 1 |
| | 11 | 1 | 2 |
| 0 | 100 | 2 | 3 |
| 0 | 101 | 3 | 4 |
| 0 | 110 | 4 | 5 |
| 0 | 111 | 5 | 6 |
| 00 | 1000 | 6 | 7 |
| 00 | 1001 | 7 | 8 |
| 00 | 1010 | 8 | 9 |
| 00 | 1011 | 9 | 10 |
| 00 | 1100 | 10 | 11 |
| 00 | 1101 | 11 | 12 |
| 00 | 1110 | 12 | 13 |
| 00 | 1111 | 13 | 14 |
| 000 | 10000 | 14 | 15 |
| 000 | 10001 | 15 | 16 |
| 000 | 10010 | 16 | 17 |
| 000 | 10011 | 17 | 18 |
| 000 | 10100 | 18 | 19 |
| 000 | 10101 | 19 | 20 |
| 000 | 10110 | 20 | 21 |
| 000 | 10111 | 21 | 22 |
| 000 | 11000 | 22 | 23 |
| ⋮ | ⋮ | ⋮ | ⋮ |
| 000000 | 1111011 | 249 | 250 |
| 000000 | 1111100 | 250 | 251 |
| 000000 | 1111101 | 251 | 252 |
| 000000 | 1111110 | 252 | 253 |
| 000000 | 1111111 | 253 | 253+ |
| 000⋯0000 | 1 | LINE SYNC (END OF LINE)* | |

27

\* 2 CONSECUTIVE LINE SYNC SIGNALS DEFINE END OF PAGE

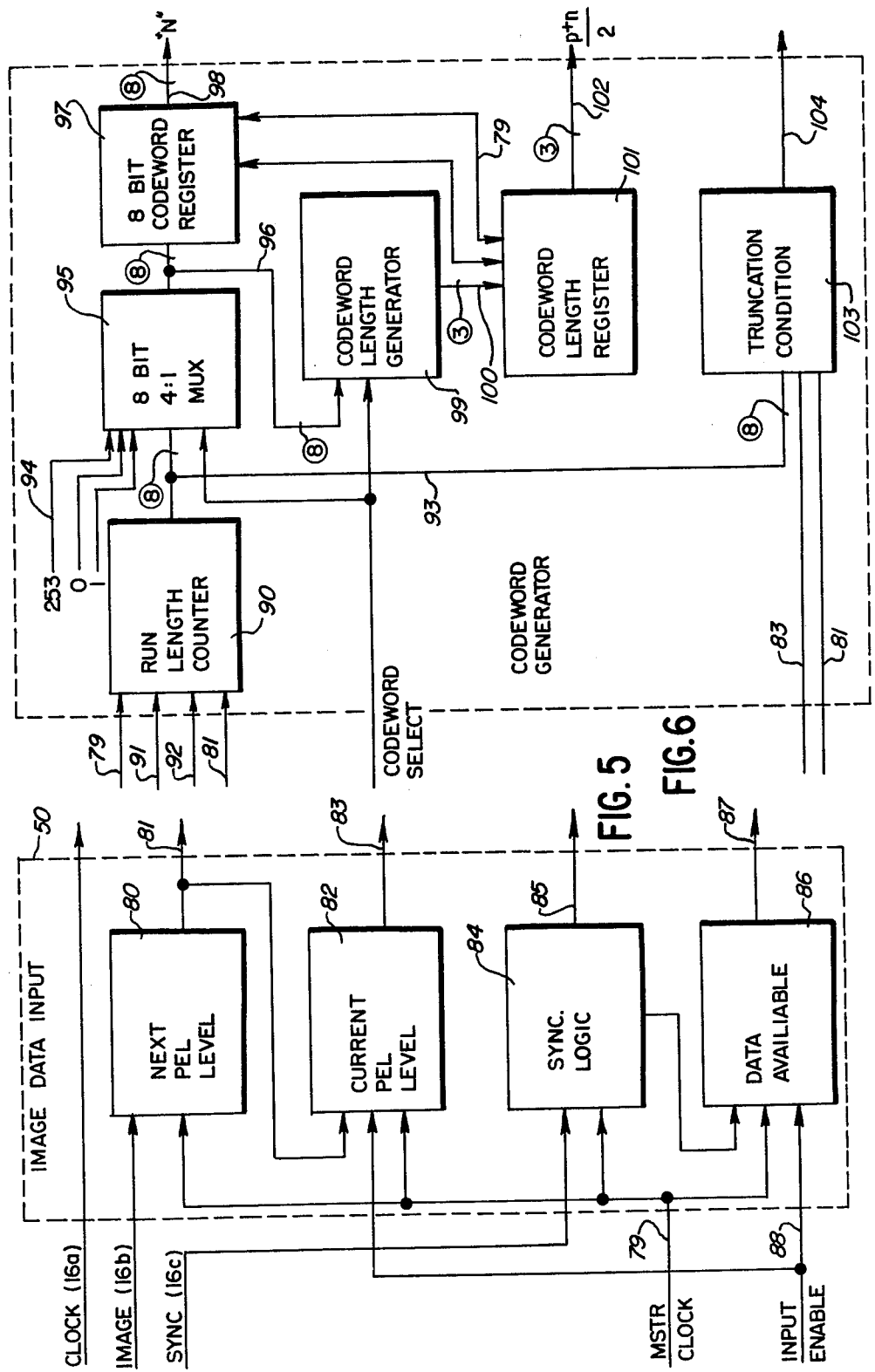

REAL TIME DATA COMPRESSION/DECOMPRESSION SCHEME FOR FACSIMILE TRANSMISSION SYSTEM

BACKGROUND OF THE INVENTION

1. Field of the Invention

This invention relates to signal redundancy reduction coding and decoding for use in conjunction with facsimile document transmission systems, and more particularly to a method and apparatus for real time, one dimensional coding and transmission of binary signals where an original document is scanned so as to be resolved into picture elements (pels) of a first level (for example black) and a second level (for example white).

2. Description of the Prior Art

Facsimile transmission is a method of transmitting documents by reducing the document to an electronic image which may be readily transmitted over conventional channels and reconstructed at a remote location. In recent years the method and apparatus for accomplishing facsimile transmission have become increasingly well developed and widely used. The amount of facsimile signal obtained by scanning an original document is enormous. For example, sampling a document of $8\frac{1}{2} \times 11$ inch paper with a sampling density of 100 pels per inch in both the primary and secondary scanning directions results in a binary representation in the amount of approximately one million pels.

Redundancy reduction coding schemes have been proposed for highly efficient transmission of facsimile signals. These schemes all take advantage of the redundancy within the facsimile signal and reduce the number of bits to be transmitted or stored without impairment of the picture quality. Examples of facsimile systems using redundancy reduction coding to minimize the required data for defining the document are disclosed in U.S. Pat. No. 4,156,880, entitled: *Method For Transmitting a Facsimile Signal by Sequential Edge Differential Coding*, issued to Toyomichi Yamada, May 29, 1979, and U.S. Pat. No. 4,136,363, entitled: *Truncated Run Length in Coding*, issued to Amitabh Saran, Jan. 23, 1979. The Yamada patent, in particular, includes a detailed description of the prior art relating to data transmission coding schemes and said description is by reference incorporated herein.

In recent years, it has become increasingly important to improve the resolution of documents which are transmitted by facsimile transmission techniques. These increased requirements for accurate and detailed resolution of facsimile transmission documents have resulted in an explosion of the information required to define a single document page. For example, if the sampling density is increased from 100 pels/inch to 300 pels/inch in both the primary and secondary scanning directions, the binary representation of an $8\frac{1}{2} \times 11$ inch document reaches approximately 8,400,000 bits. This explosion of information has greatly increased the need for data reduction and further, perhaps even more importantly, the need to be able to deal with such enormous amounts of data on a real time basis. It can readily be understood that failure to deal with such data on a real time basis would produce staggering amounts of data to be stored prior to reduction.

Accordingly, the present invention is directed to a data compression scheme with a primary concern for the speed with which the data is handled and transmitted. While many of the sophisticated data compression systems of the prior art deal mainly with techniques for reducing the data to the smallest accurate definition, the main concern of the present invention is not optimum reduction of data but, more importantly, efficient compression of the data on a real time basis.

SUMMARY OF THE INVENTION

The compression/decompression scheme of the present invention is particularly well suited for use in a facsimile transmission system of the type having raster type input and output devices, whereby the graphic image is represented by a video signal containing a predetermined number of pels for each of the plurality of substantially equidistant spaced scan lines. The resolution of a raster scanner is customarily expressed in terms of a given number of scan lines per inch along, say, a vertical axis and by a given number of pels or picture elements per inch along each scan line on the horizontal axis. For example, the facsimile scanning apparatus described in the subject disclosure provides for three hundred scan lines per inch, with three hundred pels per inch along a scan line. This defines 90,000 data bits for each square inch of document area, i.e., more than 8,400,000 bits for a typical $8\frac{1}{2} \times 11$ inch document.

The encoding device of the present invention is capable of receiving this information at a rate greater than 10 million bits per second, and compressing the data with an efficiency proportional to a function which is dependent on the order of $\log_2^N$, where N is the number of successive pels of the same level. The compression is performed during real time processing, on line with the scanning system. Typically, an $8\frac{1}{2} \times 11$ inch document is scanned, the 8,400,000 pels representing said document are introduced into the data compression scheme of the present invention, and the compressed output data representing the document is produced, all within two seconds of initiating a document scan cycle.

The scheme of the present invention also permits decompression of the data, on-line, at a data transmission rate of more than 16 million bits per second, whereby received data can be translated into an $8\frac{1}{2} \times 11$ inch facsimile document having 90,000 pels per square inch resolution within one second of data transmission.

The data coding scheme of the present invention is capable of operating at a speed equal to the speed of known raster scanning devices and at a speed greater than most known data transmissions channels. Thus, the present invention is capable of operating on-line, for reducing the data without first storing it and then transmitting the reduced data, without impeding the speed of operation of the overall facsimile transmission. The resulting increased efficiency of the facsimile system, coupled with a reduction, in fact virtual elimination, of uncoded data storage requirements results in costs savings which are effective to substantially reduce the per copy costs of facsimile transmission.

Still further objects and advantages of this invention will be readily apparent when the following detailed description is read in conjunction with the attached drawings. While certain embodiments and features of the invention are illustrated and described in detail herein, it will be understood that modifications and alterations may be made without departing from the scope and spirit of the invention as defined by the appended claims.

BRIEF DESCRIPTION OF THE DRAWING

FIG. 2 is a table setting forth the binary codewords defining the pel/binary word combinations used in the preferred embodiment.

FIGS. 5-8 are functional block diagrams of the image data input, codeword generation, codeword concatenation and 16-bit output logic modules, respectively, of the encoder module shown in FIG. 4.

DETAILED DESCRIPTION OF THE PREFERRED EMBODIMENTS

Facsimile Transmission System Overview

Figure 1:
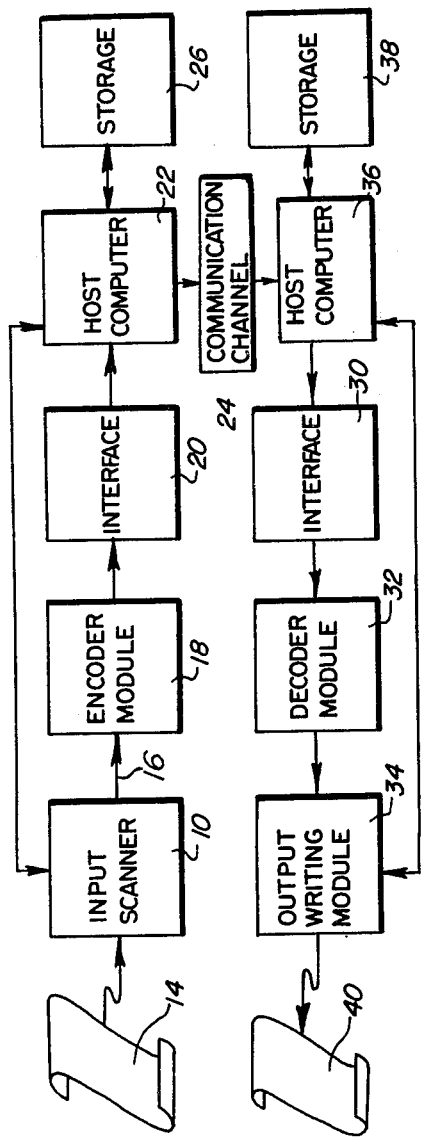
FIG. 1 is a functional block diagram of a facsimile transmission system including a data compression/decompression system in accordance with the teachings of the present invention.

With particular reference to FIG. 1, the facsimile transmission system of the present invention includes an input scanning module or scanner 10 adapted for receiving an original document 14 and scanning it by means of a raster scanning device such as, by way of example, a laser raster scanner which defines, for purposes of this disclosure, 300 scan lines per inch, each scan line being sub-divided into 300 pels per inch, the scanner operating at a speed of 1500 scan lines per second. The exemplary scanner 10 is capable of receiving and scanning an 8½×11 inch document past a scanning window such that the vertical dimension of the document is advanced through the window and the scanning cycle is completed within two seconds of initiation. The scanning module generates 90,000 pels per square inch of document area or a total of approximately 8,400,000 pels or information bits of raw data for each 8½×11 inch document page. This raw data is output at 16 and serially introduced, at a maximum burst rate of 10 million bits per second, into the encoder/compression module 18 of the present invention.

The scanner 10 produces three outputs at 16 (see FIG. 5): (1) a synchronization (sync) signal which defines when valid data is being generated; (2) a clock signal identifying a sample period for each pel; and (3) a series of pel-by-pel binary bits, each identifying the level of one pel. The data encoder/compression module 18 processes the raw image data to eliminate the redundancy of information inherent in the simple pel-to-pel image representation. In order to reduce the data required to define the image to a more compact and useable volume, a one-dimension redundancy reduction scheme is used, incorporating an entropy preserving algorithm which allows for a real time reduction of the data without any loss in the resolution achieved by the 90,000 pels per square inch image definition. The encoder device of the present invention is specifically designed to accept and reduce the data at a speed capable of operating on-line with the input scanning device and therefore, is capable of receiving and encoding in excess of 10 million pels per second. This eliminates storage of raw data for an off-line encoding mechanism and further, permits document scanning, data transmission and document reproduction in less than 10 seconds, depending on the speed of operation of the chosen transmission channel. By using on-line encoding of the image data, the amount of storage and the transmission time required to manipulate the image data is reduced by an order of magnitude. The data encoder/compression module is implemented as a special purpose peripheral processor more clearly described with reference to FIGS. 5-8 herein. The module is interfaced with an input scanner control processor such as a host computer 22 through the interface circuitry 20. The data compression module forms a dedicated data path from the scanner 10 to the intersystems communications channel 24 through the interface 20 and the host computer 22.

The host computer 22 has two primary functions in the present facsimile transmission system. First, the computer provides the synchronizing controls for controlling and synchronizing the operation of the input scanning module 10, and second, the computer accumulates the encoded data in a storage module 26 from which it may be output at a rate acceptable by a dedicated communications channel 24. By way of example, a typical telephonic communications channel is capable of receiving and transmitting data at a rate of data transmission which is substantially less than the rate of 10 million bits per second handled by the encoder/compression module. Thus storage is required in order to accumulate the data prior to entry into the transmission channel.

The host computer 22 also provides the implementation necessary to define the destination to which the data is to be transmitted, whether it be over a communications channel 24 to a remote location predetermined by information provided with the original document or to a local output module (not shown) which is on-line with the host computer of the input scanning device.

In the case where the data is transmitted to a local output module which is located on-line with the computer 22 and the input scanning module 10, the output from storage is through the host computer 22 and into an on-line computer interface device which is coupled to a decoder/decompression module and an output writing module.

In the more typical case, the information is to be transmitted via a chosen communications channel 24 to a receiving station disposed at a remote location. In this case, a host computer 36 is also provided for controlling the operation of the receiving station, as well as for receiving and accumulating the data being introduced from the communications channel. The data is accumulated in the dedicated storage module 38 in a manner consistent with accumulation at module 26, afterwhich the transmitted data is introduced into interface module 30. Again, it is desirable to accumulate all of the information for a particular document in the storage module 38 because the transmission of data through the communications channel is typically much slower than the operation time for the output writing module 34. Once the information is introduced into and stored in the storage module 38, it is output from the storage module through the host computer 36 into the output interface module 30 from which it is introduced into the decoder/decompression module 32.

Basically, the decoder/decompression module 32 performs the inverse transformation of the encoder/compression module 18 to transform the coded compressed information defining the image back to the expanded, pel-by-pel, line-by-line image definition produced by the input scanning module 10. This information is then introduced into a writing module 34 for reproducing an output document 40 which is a facsimile of the original document 14 and is defined by a 90,000 pels per square inch resolution.

The heart of the facsimile transmission system is the on-line compression/decompression scheme defined by the encoder/compression module 18 and the decoder/decompression module 32 of FIG. 1. As stated, the image data on a pel-to-pel basis is defined by the set of three coordinated signals, i.e., the image signal which defines pel level, the sample clock pulse and the sync signal. Thus, by way of definition, the image signal contains the black/white pel information in binary form to be sampled synchronously with the data clock. In the preferred embodiment, the encoding/compression module is adapted for converting the raw data bits, (each of which defines a single pel) received in serial form, to redundancy reduction coded data which is in the form of binary bits that are introduced into the computer interface device 20 for introduction into the system process controller or host computer 22.

The Algorithm

In order to more fully understand the compression/decompression scheme of the present invention, reference is made to FIG. 2, which is an exemplary redundancy reduction algorithm suitable for use with the system taught by the present invention. It is assumed that each scan line begins with a white run of some length. Since one binary level, say "0", is assigned to "white" pels and the other binary level, "1", is assigned to "black" pels, the precise number of and location of each pel level on a scan line may be readily determined by looking at the binary bit defining the pel and its location relative to the first "white" pel. Typically, the raw data will comprise a series of redundant pels of one level followed by a series of redundant pels of the second level, and so on, to define a single scan line. As shown, the algorithm comprises two parts, an information field N which defines, in binary sequence, the number of pels in a runlength, and the prefix P which actually defines the number of bits in the codeword. The prefix P allows concatenation of the codewords, as will be discussed herein.

The algorithm of FIG. 2 relies on the toggling nature of the data to reduce the redundancy therein without reducing the quality of the facsimile document. With the assumption that the first runlength is "white", the first level or color boundary, or "toggle" shift of each line, if any, will be from white to black. The algorithm is then used to assign the proper codeword to define the number of consecutive white pels prior to the level shift boundary. Thus, by starting with an arbitraty "white" runlength, and knowing the relative position of the pel to the line, the algorithm codewords readily define the pel level, the number of consecutive pels of the same level and by knowing the location of the pels relative to the boundary of the scan line, the position of each runlength. Therefore, the scheme of the present invention readily permits complete definition of the document by using the algorithm of FIG. 2.

It will be noted that the maximum runlength to be encoded by the algorithm of FIG. 2 is arbitrarily set at 253 pels. Referring first to the "black" pel level codewords, a single "black" pel is represented by the binary codeword "10", and a binary progression is then used to represent corresponding progressive black runlengths, up to 253 redundant "black" pels represented by the binary code "11111110". If the pel after 253rd pel is also "black", the codeword for "253+" signals that the following binary word does not signify a change of pel level but is a continuation of the same level. Since a typical document contains far more "white" than "black" pels, it will be noted that the algorithm code sequence with respect to the natural binary representation of the runlengths has been altered to allow for shorter definition of the corresponding codeword for a "white" 253+ runlength.

In order to permit concatenation of the consecutive codewords in an end-to-end serial bit stream without providing for spacing or boundaries between words, it is necessary to use the prefix P for indicating the boundaries of each codeword beginning and the length of the information field N. In the exemplary embodiment, the number of bits in the information field N is expressed as "n" bits. That is:

$$N = n \text{ bits}$$

In order to define the number of binary "0's" representing the prefix P, expressed as "p" bits, the following equation is used:

$$\begin{aligned} P &= p \text{ bits, where} \\ p &= n-2, \text{ and the codeword} \\ N/P &= p \text{ bits} + n \text{ bits, or} \\ &= n-2 + 2, \text{ i.e.,} \\ &= 2(n-1) \text{ bits.} \end{aligned}$$

Therefore, the codeword "10" which represents a runlength of 253+ white level pels (or one black level pel) is preceeded by no prefix since the number of bits "n" in the information field N equals two and according to the prefix length definition:

$$p = 2 - 2 = 0, \text{ hence,}$$

the completed codeword is:

$$P/N = 10$$

The information field for a runlength of two white pels (or three black pels) is "100" and the prefix length is defined as follows:

$$p = 3 - 2 = 1,$$

wherein the codeword then is defined as:

$$P/N = 0100,$$

where "0" is the prefix P and "100" is the actual information field N.

Thus, with the arbitrary selection of the first pel of each document as white, and assuming, for purposes of discussion, a document actually begins with a black border, a stream of binary codewords representing the first part of a line of the document, might comprise the following compressed data definition:

"1100000011111110000001111111101110101010010- 1000000010010000"

According to the algorithm, this defines the following redundant pel stream for the line.

1 white pel, followed by 512 black pels, followed by
3 white pels, followed by
3 black pels, followed by
648 white pels.

For this simple example, 1167 information bits of raw data have been reduced by the algorithm to sixty binary data bits, about a 20:1 reduction.

In order to minimize error in the encoding and decoding of the data, it is desirable to define the end of each scan line. This is accomplished by selecting an arbitrary binary word which cannot be confused with a redundancy/reduction codeword. The encoder generates this word to signal end-of-line after the number of pels defining one scan line have been received. In the preferred embodiment, the end of line signal comprises twenty-seven consecutive "0" level binary bits followed by a single "1" level bit. When the encoder has received a specific number of lines of information, indicating the end of a page, the encoder generates two consecutive end-of-line signals.

Figure 3:
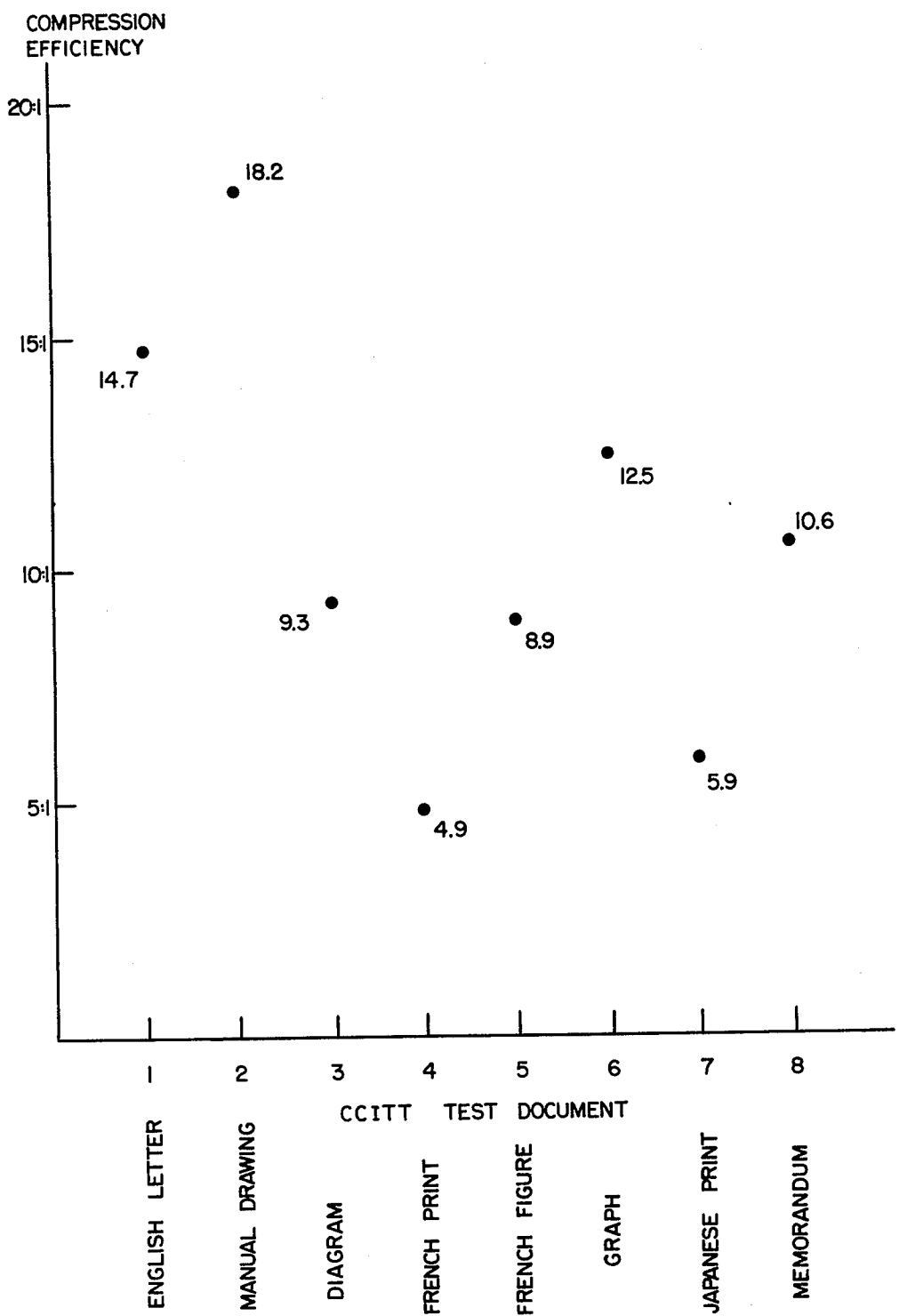
FIG. 3 is a graph showing typical data compression efficiency using the teachings of the present invention.

The data compression scheme of the present invention permits both high resolution (i.e. 300 pels per inch in both the primary and secondary scanning directions), and production of a reduced or compressed image signal definition which may be generated on-line for introduction into a host computer in real time. Shown in FIG. 3 are the compression ratios for eight sample test documents as proposed in CCITT SGXIV, in the case of the sampling density being 300 pels per inch in both the primary and secondary ordinances. The pel compression efficiency ratio ranges from a low of 4.9 pels per coded data bit for the sample French print document to a high of 18.2 pels per coded data bit for the sample manual drawing document.

The Encoder Module

Figure 4:
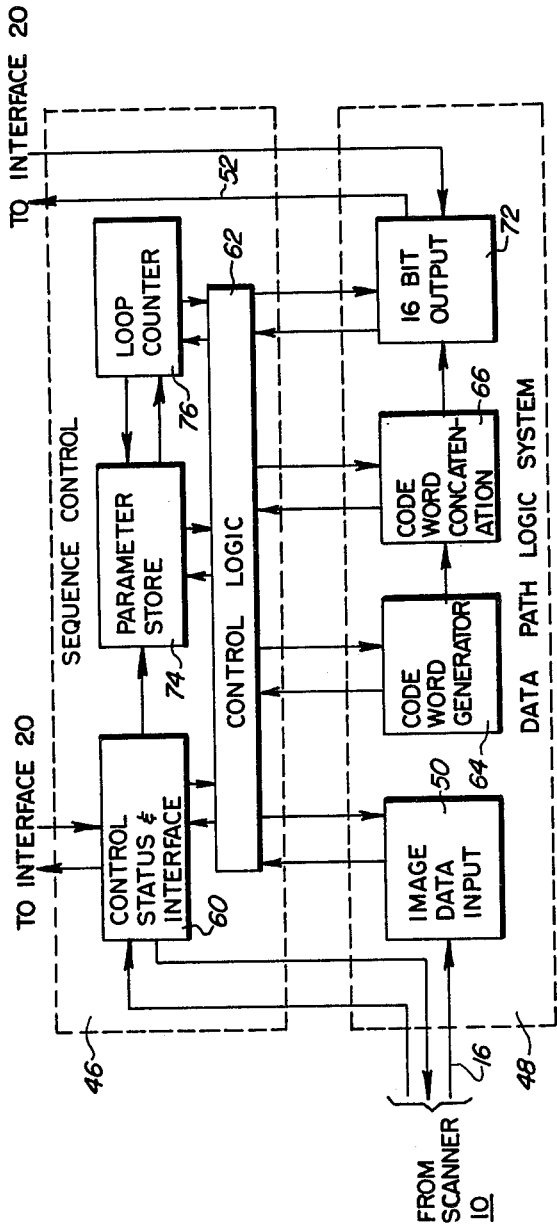
FIG. 4 is a functional block diagram of the encoder module of FIG. 1.

The architecture of the encoder module is based on pipeline processing techniques. That is, the processor is capable of simultaneously operating on different segments of data at different levels of completion of the process, rather than entry and completion of a single segment of data before entry of the next segment. As shown in FIG. 4, the data path logic system 48 comprises a four stage pipeline including the image data input logic 50, codeword generation logic 64, the codeword concatenation logic 66 and the output logic 72. The encoder pipeline is designed with a single phase clock, provided by the sequence control 62 of the sequencing system 46. Thus, the state transition and the data path sequencing occur on identical clock transitions. This technique permits consumption (or entry) of one pel per clock period whenever valid input data is available.

The pipeline logic is controlled and advanced in synchronous fashion by the sequencing system 46, which implements a finite state machine capable of advancing through a series of states based on prior state "history" and, in addition, sequence control input information. The Logic Tables hereinafter will aid in the understanding of the sequencing used in the preferred embodiment. Particular reference is made to Table III, setting forth the state-by-state transition of the encoder module.

The control and status interface 60 contains the specific circuitry, chosen in a manner well known to those who are of ordinary skill in the art, for linking the sequence control 62 to the computer interface module 20. In the preferred embodiment, part of the information conveyed through the computer interface module is in the form of 12-bit binary numbers which represent a set of "scan parameters". These parameters are introduced into and retained in the parameter storage 74, which comprises a RAM memory. A loop counter 76, comprising a 12-bit binary counter and comparison network, uses the scan parameter information in conjunction with a document page lead-edge signal and a sync signal generated by the scanning module 10 to define the rectangular image area to be encoded, i.e., the valid data portion of the raw data. For example, if the raster scanner has a sweep of 14 inches, and the document being scanned is $8\text{-}\frac{1}{2} \times 11$ inches, the scan parameters will define the valid data as being confined in an $8\text{-}\frac{1}{2} \times 11$ rectangle which is referenced to the lead-edge and sync signals.

The initial stage of the data path is the image data input logic 50 shown in more detail in FIG. 5. The module 50 receives three signals from the scanner module 10 at line 16, shown in FIG. 5 as 16a (clock), 16b (pel level) and 16c (sync). The binary pel level signal on line 16b defines the level of the pel currently being observed or scanned. The clock signal on line 16a defines when the image information has been updated to the next pel and thus, when the image data line 16b should next be sampled. The clock signal is input into the sequencing control system 46 and provides the primary clocking signal for sequencing the pipeline stages of the data path system 48. The sync signal at line 16c is either HIGH or LOW, a LOW level indicating when the laser is within a certain physical range of the scan line and therefore, that valid data is being transmitted. The transition of the sync signal from HIGH to LOW will occur at a fixed physical position along the scan line, providing a reference point for the scan parameters.

Referring to FIG. 5, the image signal is introduced into a "next pel color" flip-flop 80, and there synchronized by the master clock signal provided on line 79 from the sequencing control system 46. The output at 81 of flip-flop 80 is introduced into a "current pel" flip-flop 82, which is also synchronized with the clock signal 79. Thus, the output of flip-flop 82 is always one pel behind the output of flip-flop 80, providing at outputs 83 and 81 the level of the current and next pels in sequence, respectively. Once set, the flip-flop 82 does not reset until a color change is indicated, thus providing a "history" of the current runlength. Both flip-flops 80 and 82 are preset to a "white" pel level at the beginning of each scan line. The synchronizing logic 84 receives the sync signal on line 16c and is synchronized with the master clock signal on line 79 to provide an output on line 85 for indicating the beginning of a scan line. The data available flip-flop 86 synchronizes a valid data signal at line 87 with the beginning-of-line signal of flip-flop 84 and an enabling signal at 88, which is produced by the sequencing control system 46 and is dependent upon the scan parameters in RAM 7. Thus, the data input logic 50 produces four synchronized data signals, as follows: (1) next pel level on line 81; (2) current pel level or run color on line 83; (3) beginning-of-line on line 85; and (4) valid data available on line 87. These signals are introduced into the sequence control logic 62.

By way of summary, the codeword generation logic 64 includes circuitry for accumulating a runlength of consecutive single level pels, which identify a single color runlength. This becomes one input to the concatenation logic 66. In accordance with the algorithm in FIG. 2, the maximum runlength is 253 pels. The position of the most significant bit in the binary representation of each runlength is also monitored to determine the actual length of the final codeword. This generates a second input to the concatenation logic 66.

The codeword generation logic of the preferred embodiment is shown in detail in FIG. 6. The runlength counter 90 comprises an eight bit presettable binary counter. The next pel level signals are introduced into the counter via lines 81, along with a clock signal 79, a load or preset signal 91 and a count signal 92. The counter is preset at line 91 to offset the count in accordance with the algorithm of FIG. 2. Then, the clock and count signals, which are synchronized with the scanner operation, count the number of pels produced which are of the same color. When the color of the "next" pel changes, the output of counter 90 is stored in register 97. If a count of 253 pels is reached before a color change is indicated, the signal on line 94 is selected by the multiplexer 95 and this is stored in register 97. If an end-of-line or end-of-page signal is received during a color run, then this signal is output on lines 96 into register 97. Thus, with the combination of the counter 90, the multiplexer 95 and the codeword select logic provided by the sequencing module 46, the information field N is generated on line 98 by register 97.

The runlength information is introduced into the "4 to 1" multiplexer 95, which allows output selection of the information field comprising the counter 90, the "253+" signal 94 and the level signals "0" or "1" to generate a binary output on the eight parallel lines 96 which defines the information from which an actual codeword can be derived. The codeword register 97 is an 8-bit register which receives the codeword information field signal produced by the multiplexer 95. Once a single runlength of "1" to "253+" has been determined and generated as an output on lines 96, it is held in register 97 until the next clock cycle. On the next clock cycle, concatenation of the codewords is performed.

The output from the register 97 on the eight parallel lines 98 comprises the information field corresponding to the pel runlength in accordance with the algorithm of FIG. 2. Since it is known that the first runlength of each line is white, it then follows that the consecutive runlengths will be "white-black white, etc.", in a two-position, toggling nature. Thus, knowing that the first runlength is white, it is easy to determine what color is represented by the current information field stored in register 97 since its position relative to the first runlength is known.

The signal on lines 96 is also introduced into the codeword length generator 99. The generator 99 determines the position of the most significant bit in the information field in order to define the length of the codeword and hence, the length of the prefix in accordance with the formula $$p = n - 2,$$

where p is the prefix length and n is the number of bits in the codeword information field, corresponding to the algorithm of FIG. 2. The three bit output on the three parallel lines 100 corresponds to one-half the length of the final codeword, including the prefix. This is sufficient since the codeword will always have an even number of bits, according to the algorithm, whether or not n is even. That is, the number of bits in the codeword length is always:

$$n + p = n + n - 2 = 2(n - 1) \text{ or } 2(p + 1),$$

which is always an even integer. The three-bit codeword length signal is stored in register 101 at the same time as the information field is loaded in register 97.

Thus, when the runlength is greater than 253 pels, i.e., a "253+" condition, the codeword generated by registers 97 and 101 will indicate only a truncated portion of the actual one color runlength. It is therefore necessary to indicate when a truncated condition exists so that it can be determined that the next codeword is a continuation of the previous run. The truncation logic 103 monitors and determines when a count of 253 is reached and is operable to produce the proper output on line 104, triggering the sequencing module 46 to activate the codeword select signal.

The pipeline output of the codeword generator 64 consists of the codeword information field N on lines 98 and the codeword length signal, here (p+n)/2, on lines 102. The codeword concatenation logic uses the inputs on lines 98 and 102 to concatenate the variable length codewords in such a manner as to include the appropriate prefix P and appropriate information field N, in accordance with the algorithm of FIG. 2. This information is then output as a parallel word comprising concatenated encoded data representing, in compressed form, the image on the original document. In the preferred embodiment, a 16-bit parallel word is used since this is compatible with the requirements of the selected host computer 22. The codeword concatenation logic is shown in detail in FIG. 7. The three main components comprise the 14-bit left shift logic 105, the residue register 106 and the 16-bit right shift logic 107. It will, of course, be recognized by reference to FIG. 2 that combination of whole codewords will now always be capable of producing precisely the 16-bits of information required to generate a 16-bit parallel output word. Therefore, concatenation of the codewords is performed in order to make maximum use of the system capabilities. Essentially, the residue register 106 retains the bit stream representing previously entered codewords until a string of sixteen bits are available for output. The 14-bit left shift logic receives up to eight bits defining the information field N on lines 98 and by shifting the information to the left, or toward the most significant bit, the concatenation module is operative via lines 109 to concatenate the bit stream with the residue bits in register 106. The 16-bit right shift logic 107 is used to shift the last entered codeword to the right and into the previously generated bit stream to provide concatenation of the last entered codeword with the bit stream, i.e., the contents of register 106.

Figure 7:
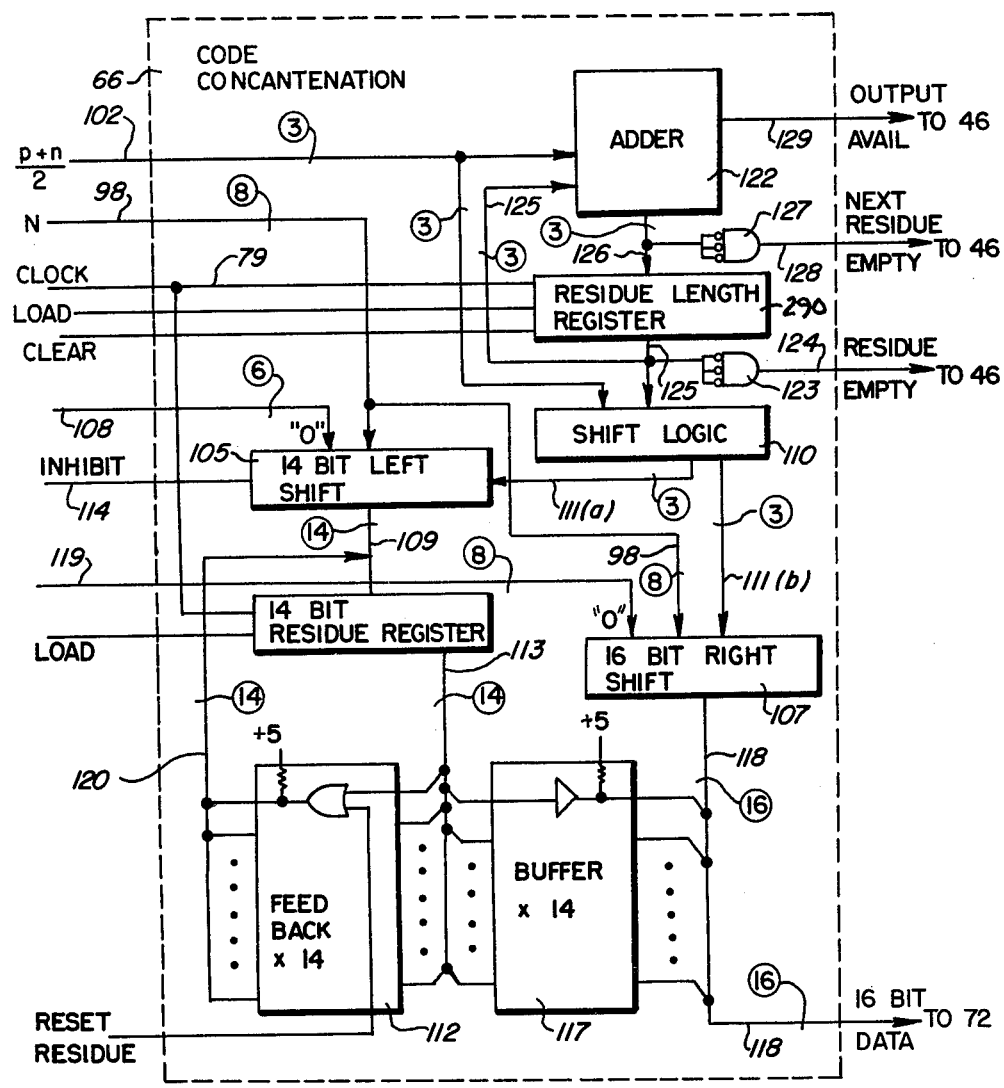
Figure 8:
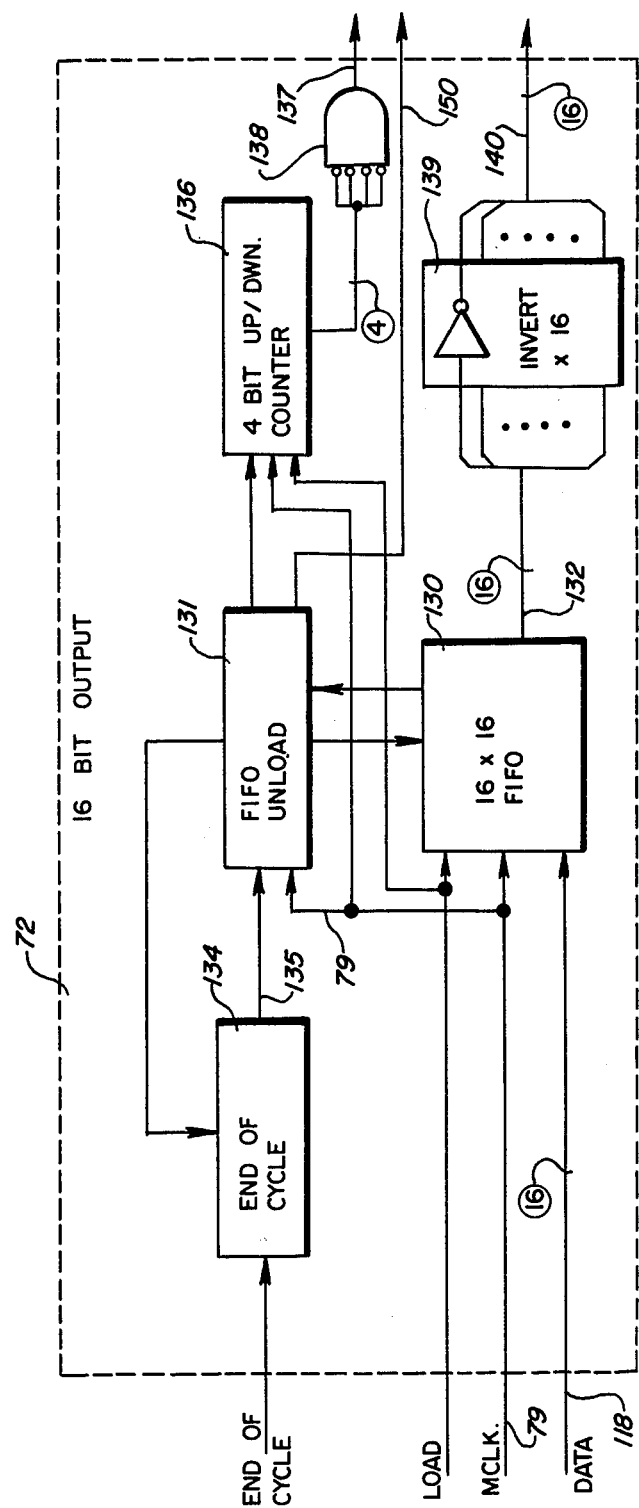

The specific logic sequences for the left and right shift logic modules are set forth in Tables IV and V, respectively. The primary or pipeline inputs of the codeword concatenation logic of FIG. 7 are the signals on lines 98 and 102. The signal "N" on line 98 is the information field of a codeword P/N and includes from two up to eight parallel bits, in accordance with the algorithm of FIG. 2. The quantity (p+n)/2 on 102 is generated by the codeword length register 101 (FIG. 6) and comprises three parallel bits defining one-half the number of bits (p+n) in a complete codeword, in accordance with the algorithm.

The signal N is introduced into the 14-bit left shift logic 105 with the six high-order bits being zero-filled via the signals present on the six parallel lines 108. The left shift logic performs a left shift on the contents, in accordance with the three-bit control signal on lines 111(a), which is generated by the shift logic 110 from the quantity (p+n)/2 and the contents of the residue register 106. The three-bit signal on line 111(a) is an integer defining one-half the actual position shifts. Thus, an even number of shifts is always made.

The output of logic circuit 105 present on the fourteen parallel lines 109 is an appropriately left shifted representation of "N" with zero fill. The signal is open-collector and inverted. This representation of "N" is loaded into the residue register 106 and is present on the fourteen parallel lines 113, where it is introduced into the open-collector WIRE/OR feedback network 112 for feedback to the signals on line 109 via the fourteen parallel lines 120. The signal on lines 120 is in bit-by-bit correspondence with the signal on lines 109. This scheme permits combination of consecutive "N" signals to provide for concatenation of the codewords.

For instance, in a typical example, it can be assumed:

$P_1/N_1 = 0000111111$, and therefore, $N_1 = 111111$.

When $N_1$ is loaded into the register with zero fill, the signal becomes:

00000000111111, where the six low order bits (...111111) are $N_1$, the six high order bits (000000...) is the signal present at lines 108 and the remainder (...00...) is zero fill, that is:

```
108      fill    "N."
000000    00    111111
```

In this example, as will be explained, the signal on lines 111(a) initiates a shift to the left of four bit positions so that the data for $N_1$ in logic circuitry 105 becomes:

00001111110000.

This is inverted and output at lines 109 as:

11110000001111.

This representation of $N_1$ is present on lines 113 and, via feedback network 112, is present on lines 120.

Now, assuming:

$P_2/N_2 = 10$, $N_2 = 10$, and therefore, according to the algorithm, it can be seen that when $N_2$ is loaded into shift logic circuit 105 the data will become:

```
108       fill     "N2"
000000   000000    10
```

In this case, a shift of two bit positions is called for, and the signal becomes:

00000000001000.

After inverting, the signal is present on lines 109 as:

11111111110111.

Now, at this point the representations of $N_1$ and $N_2$ are:

$N_1 = 11110000001111$, and $N_2 = 11111111110111$.

The WIRE/OR logic of network 112 is LOW true, i.e., the presence of an "0" at either of two positions generates an "0" output. Therefore when $N_1$ is combined with $N_2$ by the feedback loop, the combined or concatenated signal W (as inverted) is defined as follows:

$N_1$ = 11110000001111,
$N_2$ = 11111111110111, and with LOW true concatenation, this is:
W = 11110000000111.

If this is inverted, it can be seen that twelve of fourteen potential bit positions have been filled with valid data, with $P_1/N_1$ concatenated with $P_2/N_2$. That is, by inverting, W becomes:

W = 00001111111000, where
$P_1/N_1$ = 0000111111 , and
$P_2/N_2$ =           10 , and
                          00 is the remainder or residue.

The next input $N_3$ to logic 105 will fill the remainder and, possibly, flow over, which leads to the next segment of the pipeline.

Before discussing the overflow situation, it should be stated that there is an intermediate circumstance where the number of bits in a plurality of codewords $P_1/N_1$, $P_2/N_2$... $P_n/N_n$ is precisely sixteen bits and therefore, defines a complete 16-bit parallel word without residue. In this case, and also during initialization, it is necessary to artificially load the residue register 106 with all "1's" (i.e., inverted "0's") and accordingly, reset the feedback network 112 via an enabling signal. This is provided by the logic of the adder 122, the residue length register 290 and the shift logic 110, as will be explained. When exactly sixteen bits are present, an inhibit signal is also present on line 114 to inhibit the output of the shift logic 105. The inhibit signal is not required during initialization.

In the case where a total of more than sixteen bits are present by the introduction of $N_3$ into logic 105, the circuit operates to deal with the overflow. In the stated example:

$P_1/N_1$ = 0000111111, and $n_1$ = 10 bits
$P_2/N_2$ =           10, and $n_2$ = 2 bits.

Thus a total of twelve bit positions in a sixteen bit parallel word have been filled by concatenation of $P_1/N_1$ with $P_2/N_2$. Assuming, now that:

$P_3/N_3 = 00011111$, and $n_3 = 8$ bits, it can be seen that total of twenty bit positions are filled by these three codewords. In this case, the concatenation logic is required to take the first sixteen of the twenty bits and output them as a completed 16-bit parallel word representing $P_1/N_1$, $P_2/N_2$ and the four most significant bits (m.s.b.) of $P_3/N_3$. That is, the output word $W_1$ at lines 118 (ignoring any inverting) is:

$W_1$ = 0000111111100001, where
          0000111111             = $P_1/N_1$,

-continued

10 = $P_2/N_2$, and
0001 = four m.s.b. of $P_3/N_3$.

The residue of $P_3/N_3$ (...1111), is dealt with in the same manner as with $P_1/N_1$ and $P_2/N_2$ until the next total of sixteen bits is accumulated.

This is accomplished by the signals present on lines 111(a) and 111(b), produced by shift logic 110. That is, when at least sixteen bits have been accumulated at register 106, the shift signal on line 111(b) shifts all but the four least significant bits (...1111) of the sample $P_3/N_3$. Thus when $P_4/N_4$ is introduced it is concatenated with the residue "r" of $P_3/N_3$ and so on.

In order to accomplish this, and properly handle the four most significant bits of $P_3/N_3$ a 16-bit right shift logic 107 is provided. The shifting sequence of circuit 107 is set forth in Table V. In this connection, the 3-bit adder circuit 122 continuously monitors the quantity (p+n)/2 associated with each codeword and present on lines 102 to determine when at least sixteen bits are available for defining an output word at lines 118. At this time, an "output available" signal is generated on line 129 and an output data word W is introduced into the FIFO 130 (FIG. 8) via lines 118.

Using the examples of $P_1/N_1$, $P_2/N_2$ and $P_3/N_3$, the four most significant bits of $P_3/N_3$ are shifted into and combined with the twelve bits of $P_1/N_1$ and $P_2/N_2$ in register 106. At the same time, the entire signal representing $N_3$ on line 98 is loaded into the right shift logic 107, with zero fill. This is then shifted, with zero fill, in accordance with the signal on lines 111(b). In the example, $P_3/N_3$ is shifted four bits to the right so that the signal representing $N_3$ is as follows at logic 107:

$N_3$ = 0000000000011111 before shifting, and
= 0000000000000001 after shifting, with the four least significant bits (l.s.b.) (...1111) being shifted out. After inverting, the signal at 107, representing $N_3$, becomes:

$N_3$ = 1111111111111110.

By combining this with the twelve identified, concatenated bit positions (inverting ignored) of $P_1/N_1$ and $P_2/N_2$, the signal becomes:

$P_1/N_1$ = 0000111111,
$P_2/N_2$ = 10,
Residue = 00, and concatenated,
W (at 113) = 00001111111000, further at 107,
$P_3/N_3$ = 0000000000000001.

The signal on line 129 enables the inhibit signal on line 114, whereby the previous concatenation of $P_1/N_1$ with $P_2/N_2$ is not contaminated with the residue bits of $P_3/N_3$. Therefore, by combining the fourteen positions on lines 113 with the fourteen most significant bits positions of the sixteen parallel lines on 118 through the open-collector buffer 117, a sixteen bit output word is generated, as follows:

$P_1/N_1$ $P_2/N_2$ R
W (at 113) = 0000111111 10 00, where R = residue,
and
$P_3/N_3$ = 0000000000000001.

Concatenating, and ignoring inversion, i.e., with HIGH as true, this becomes:

W = W(113)/W(118) = 0000111111100001, where
$P_1/N_1$ = 0000111111 ,
$P_2/N_2$ = 10 , and
4 msb $P_3/N_3$ = 0001.

The sixteen bit output word W present at lines 118 is output to FIFO 130 whenever the enabling signal is present on line 129. The process is then repeated using the remaining four least significant bits of $P_3/N_3$ as the first four filled bit positions of the next output word.

A 3-bit residue length register 290 is provided and receives, via the adder circuit 122, the three bit codeword length signal (p+n)/2 on lines 102. Thus, the three-bit binary signal defining one-half of the length of the contents in residue register 106 is stored in register 121, as updated in synchronous manner by the output of the adder circuit 122. The output of register 121 is continuously monitored by the gate circuitry 123 to determine when the register 106 is empty in order to determine when the register is to be loaded or cleared, via the sequence control module 46, by generating the appropriate output signal on line 124, which in turn controls the register 106 at lines 115 and 116.

The adder circuitry 122 comprises a three-bit adder for adding the one-half length signal of a new codeword on lines 102 with the signal from the residue length register 121 on lines 125 in order to determine when at least sixteen bits are available for defining a word W at line 118. The three bit output on lines 126 represents one half of the length of the new residue length register contents. This output is monitored at gate circuitry 127 to determine when the next residue contents will be zero or empty, indicating on line 128 when exactly sixteen bits are available for output as a binary word and there is no residue. This signal is input to the control sequence module 46 for providing control signals to 14-bit left shift logic 105 and the 14-bit residue register 106.

The shift control logic circuit 110 receives as inputs the unmodified codeword length signal on line 101 and the signal from the residue length register 121 on lines 125 and forms therefrom the three-bit shift value signals 111(a) and 111(b) in accordance with Tables IV and V for controlling the incremental position shifts of the shift logic modules 105 and 107.

Figure 9:
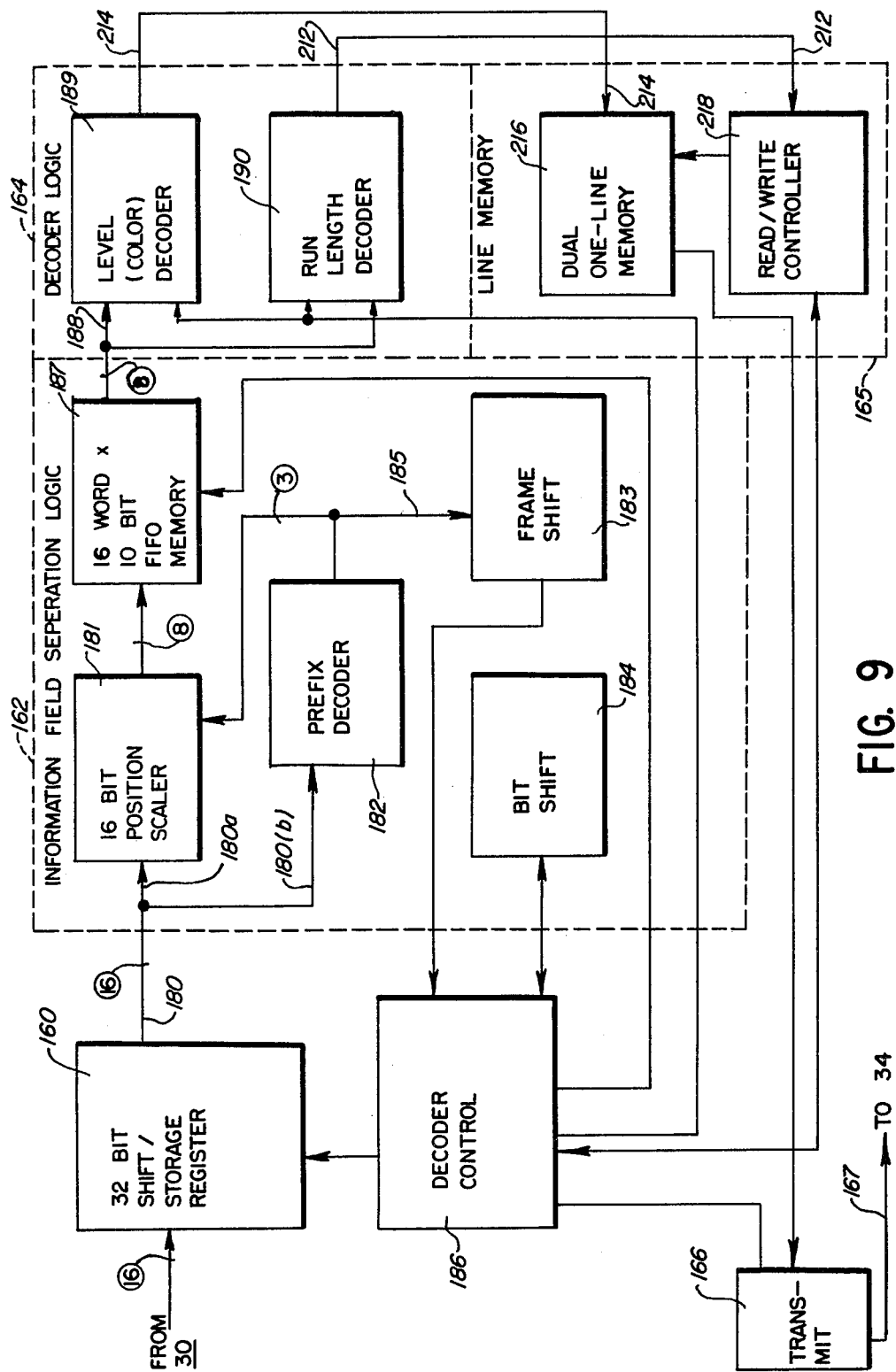
FIG. 9 is a functional block diagram of the decoder module of FIG. 1.

The sixteen-bit output words produced on lines 118 are introduced into the output logic module 72, shown in FIG. 9. A sixteen-by-sixteen first-in, first-out circuit (FIFO) 130 is provided for receiving the sixteen parallel bits on lines 118 which define a concatenated, coded image word W. The FIFO is loaded synchronous to the master clock signal provided on line 79. Due to the nature of the illustrated design, the "loading" and "unloading" operations of the FIFO are asynchronous, providing buffering between outputs becoming available from the concatenation module 66 and the availability of a bus of the host computer 36 for data transfer. The FIFO unload circuitry 131 comprises a four-state finite state machine (FSM) for generating a four-step signal on line 150 to the sequence control module 46 to: (1) indicate that a data word W is available at 132; (2) request that the data be received by a data bus of the host computer; (3) indicate at 133 when the data has been transmitted to the bus and (4) advance the sequence for loading the next word W. The cycle is terminated by the end-of-data cycle signal provided on line 133 and produced as an end-of-cycle flag on line 135 by the generator 134.

A 4-bit UP/DOWN counter 136 monitors the count in the FIFO 130 and is up-counted when the FIFO is loaded or down-counted when the FIFO is unloaded. When a FIFO empty condition exists, an output is produced on line 137 by gate circuitry 138. This signal is introduced into the sequence control module 46 to indicate the end of a data cycle.

An inverter 139 may be provided, as required, for inverting the data on lines 132 prior to its introduction into the interface module 20 via lines 140.

As stated, the sixteen bit-parallel words W are then routed to the host computer 22 for transmission over selected channels 24 to a host computer 36 for a remote receiving station. The data is then transmitted via an interface module 30 to the decoding module 32 for decoding of the data back to its original pel-to-pel form.

The Decoder Module

Figure 10:
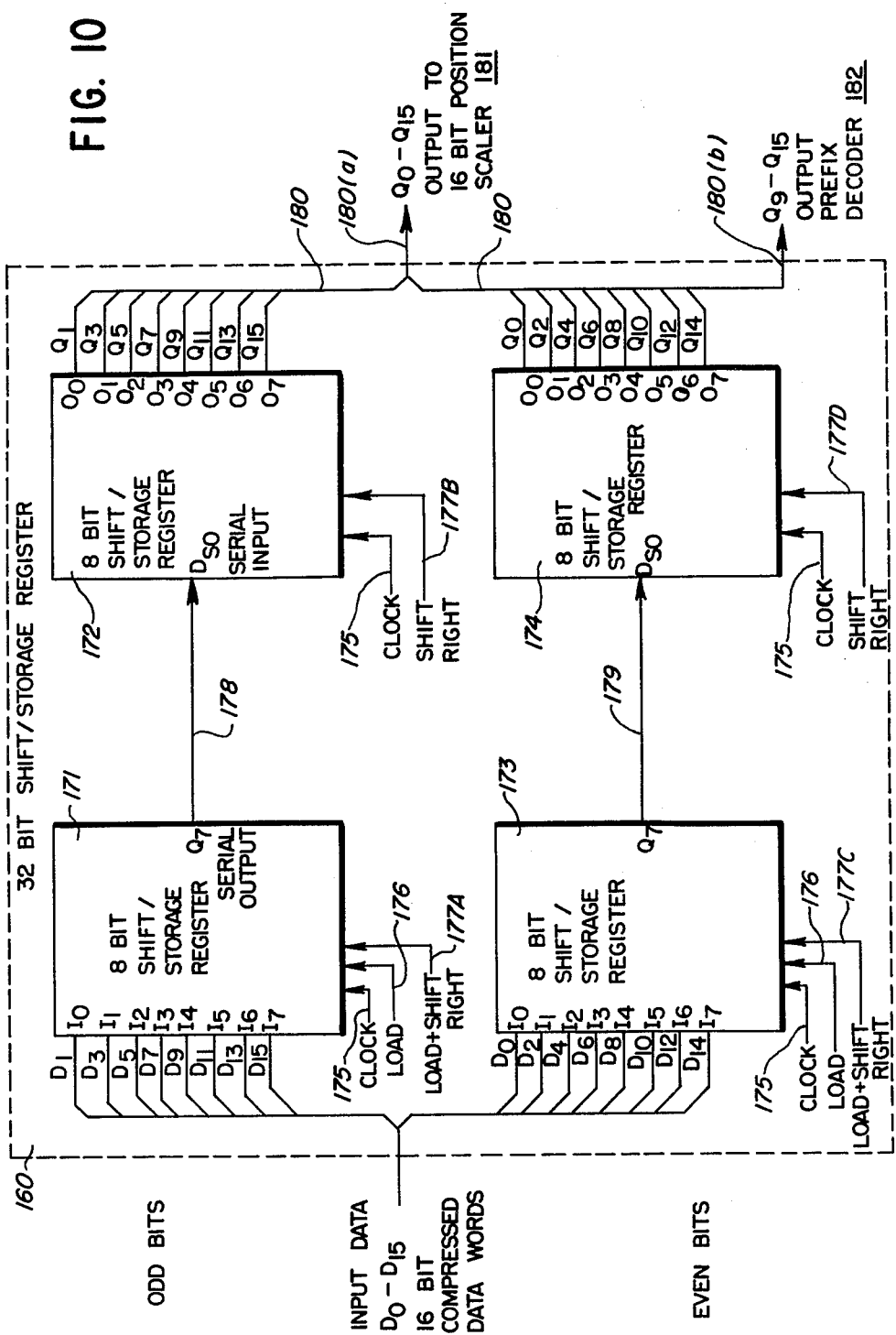
FIGS. 10-11 are functional block diagrams of the logic modules of the decoder module shown in FIG. 9.

As with the encoder module 18, the architecture of the decoder module 32 is based on pipeline processing techniques. A system block diagram of the decoder module is illustrated in FIG. 9. The decoder receives the 16-bit parallel concatenated codewords defining the image data and decodes these into expanded, pel-to-pel information bits from which a facsimile document with 90,000 pels per square inch resolution can be produced. Essentially, the decoder comprises a 32-bit SHIFT/STORAGE register 160, an information field separation logic circuit 162 including a prefix decoder 182, decode logic 164, a line memory 165 and transmission logic 166, which provides expanded serial image data information to writing module 34 via line 167. The logic Tables VI-IX set forth in detail the logic states and transition sequencing for the decoder of the preferred embodiment.

single 8½×11 document can be decoded for transmission to the output writing module 34 within one second of cycle initiation. As shown in FIG. 10, the sixteen parallel input data bits are separated in even numbered bits $D_0, D_2, D_4, \ldots D_{14}$ and odd numbered bits $D_1, D_3, D_5, \ldots D_{15}$. The even numbered bits are introduced into register 173 simultaneously with the introduction of the odd numbered bits into register 171 during the clock period when both the load signal 176 and the signal 177 (load and shift right) are active. During data shift, when the signal on line 177 and the shift right signal on line 177a are active, two data bits (one even and one odd) are shifted out of the register 171 and 173 and introduced into the series register complements 172 and 174, respectively, via the serial transmission lines 178 and 179.

The sixteen parallel outputs of the register are output on lines 180 with bits $Q_0$–$Q_{15}$ introduced into the position scaler 181 of the information field separation logic 162 and with bits $Q$–$Q_{15}$ also being introduced into the prefix decoder 182.

The 16-bit output at lines 180 contains one or more codewords P/N, where "P" is the prefix and "N" is the information field, as defined by the algorithm of FIG. 2. The information field separation logic 162 separates the prefix P from the information field N and forms an 8-bit information byte in which the information field N of each codeword is right-justified with the leading bits zero-filled as needed.

To properly separate the information field N from the prefix P, the codeword P/N must be "FRAMED", i.e., the most significant bit of the codeword P/N is shifted into $Q_{15}$, which is the most significant output bit position of register 160. Frame shift logic 183 signals the decoder control 186 when a codeword has been FRAMED, which causes shifting to cease.

The following table defines the operation of the prefix decoder 182:

TABLE I

| | | Prefix Decoding Logic | | |
|---|---|---|---|---|
| NUMBER OF ZEROES IN PREFIX | NUMBER OF BITS IN CODEWORD | SCALE FACTOR F | FRAME COUNT PRESET (7+F) or (14−p) | FRAME SHIFT COUNT 15−(7+F) | BITS SHIFTED FOR EACH FRAME (@ 2 BITS PER SHIFT) |
|---|---|---|---|---|---|
| p | 2(p+1)* | (7−p) | 14−p | 1+p | 2(1+p) |
| 0 | 2 | 7 | 14 | 1 | 2 |
| 1 | 4 | 6 | 13 | 2 | 4 |
| 2 | 6 | 5 | 12 | 3 | 6 |
| 3 | 8 | 4 | 11 | 4 | 8 |
| 4 | 10 | 3 | 10 | 5 | 10 |
| 5 | 12 | 2 | 9 | 6 | 12 |
| 6 | 14 | 1 | 8 | 7 | 14 |
| 7 | 28* | 0 | 1 | 14 | 28 |

*UNIQUE, indicates end-of-line

As shown in FIG. 10, the 32-bit SHIFT/STORAGE register 160 comprises four 8-bit SHIFT/STORAGE registers 171, 172, 173, 174—register 171 being in series with register 172, and register 173 in series with register 174. The serial register pair 171, 172 is in parallel with the serial register pair 173, 174. This arrangement makes use of the characteristics of the code structure according to the algorithm of FIG. 2, wherein all codewords have an even number of bits. Two bits are shifted per clock cycle, doubling the bit shifting speed of the decoder and resulting in a commensurate increase in the speed of the decoder operation. Using this technique, the sixteen-bit, concatenated codewords W defining a When a codeword has been framed, the prefix decoder 182 identifies the number of "0's" in the prefix and generates the output functions shown in Table I as a function of p, where p is number of bits (0's) in the prefix P. The scale factor F (where F=7−p) is applied to the scale select input of the 16-bit position scaler 181, the framed codeword P/N being present at the data input 180a. The scaler 181 applies the scale factor F to the framed input data P/N and outputs the 8-bit information byte "B" in which the information field N is right justified with leading bits zero filled. At this point, the information field N is redefined as an 8-bit right-justified byte B with zero fill. The decoder control 186 loads the information byte B into the FIFO memory 187, and resets the frame shift logic 183 to count "1+p" shifts of the 32-bits shift/storage register 160, as shown in Table I.

When shifting is initiated, "1+p" shifts will occur before the frame shift logic 183 again signals the decoder control 186 to stop shifting. As shown in Table I, two bits are shifted for each frame count so "2(1+p)" bits are shifted. This is the same number of bits in the codeword. Therefore, when "1+p" shift counts are completed and shifting stops, the previous codeword is completely shifted out of the register 160 and the next codeword is FRAMED. The bit shift logic 184 counts the number of bits shifted by register 160 during the FRAMING operation and maintains communication with the register 160 via control 186. Thus a complete codeword is always available on line 180(a). When 16 bits have been shifted, the bit shift logic disables shifting and signals the decoder control 186 to load the next 16-bit compressed data word from interface 30 into the register 160. When the data has been loaded, the decoder control enables shifting. This maintains concatenation of the codewords.

Figure 11:
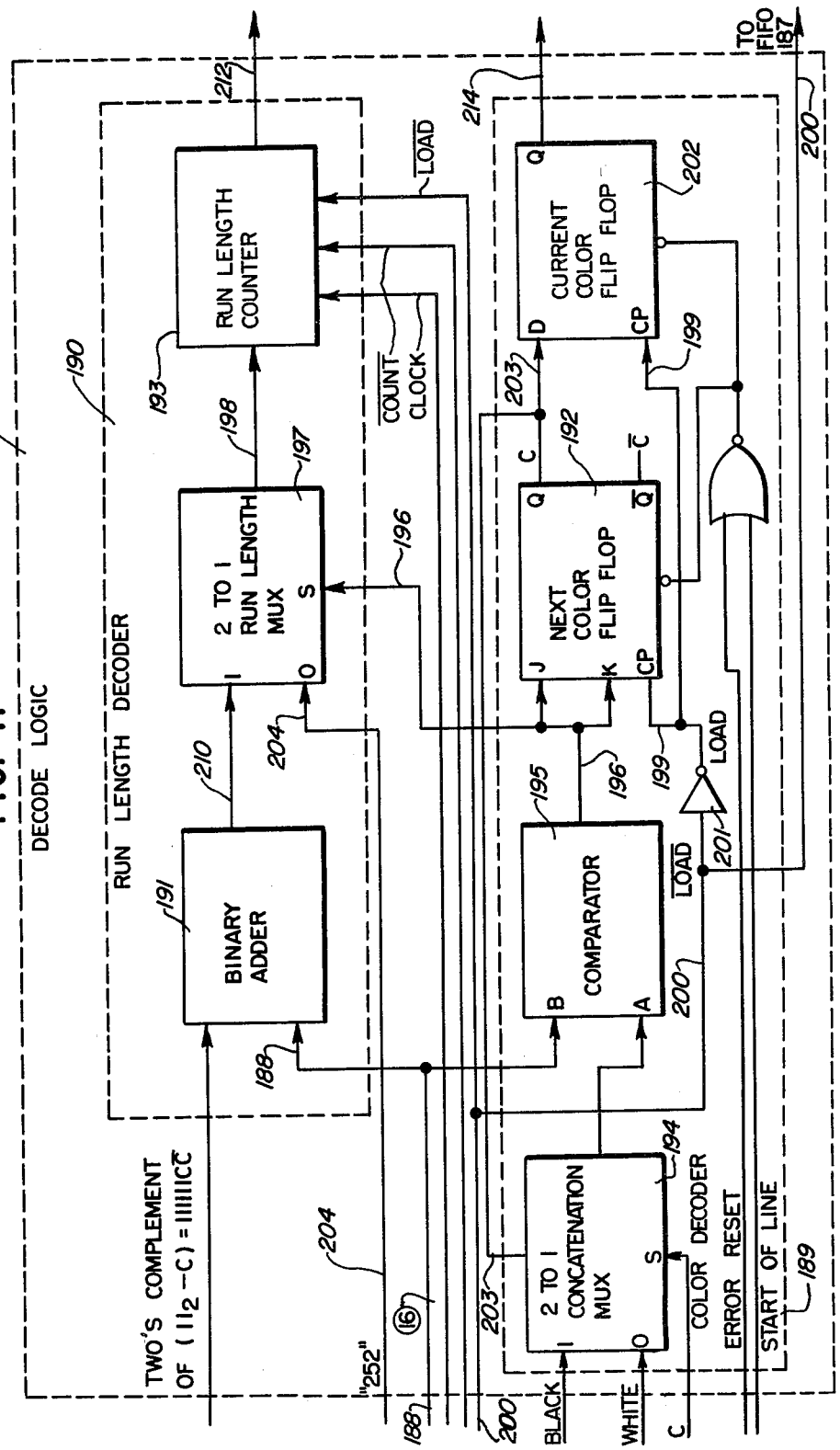

The information byte B at the output of the FIFO 187 is introduced via parallel lines 188 into the pel level or color decoder circuit 189 and the runlength decoder 190 of decode logic module 164, shown in detail in FIG. 11. The output of the next color flip-flop 192 provides the additional input condition. The decode logic 164 generates the count to be loaded into the runlength counter 193 for the current runlength and determines whether or not to change color for the next runlength.

In this connection, there are three cases to consider:
(1) White truncation, i.e., an information field representing a runlength of 253 white pels to be followed by a runlength of the same color, where consecutive concatenated codewords are required to define an entire runlength;
(2) Black truncation; and
(3) Non-truncation, i.e., the current runlength is 253 or less defined by a single codeword, to be followed by a runlength of the opposite color.

This can be expressed in table form, as follows:

information byte signal is connected to input B of the comparator. For case No. 1, input A is the same as input B and the comparator output on line 195 is LOW. The comparator output 196 is connected to the select input of runlength counter multiplexer 197 and the inputs J and K of the next color flip-flop 192. The low signal on line 196 selects "252" for the output 198 of the mutiplexer 197 and this is introduced into the runlength counter 193.

The LOW signal 196 on the inputs J and K of the next color flip-flop inhibits the color outputs from changing state when clocked at line 199 with the trailing edge of the LOAD signal (high-to-low) from the controller 186 via inverter at 201. The LOAD signal 199 is also introduced into the clock input of the current color flip-flop 202. The $\overline{\text{LOAD}}$ signal on line 200 is introduced into the runlength counter 193. The leading edge of LOAD (low-to-high) clocks next color output Q into current color flip-flop 202 via line 203. The trailing edge of $\overline{\text{LOAD}}$ (low-to-high) loads the signal "252" into the runlength counter 193 via line 204 and the multiplexer 197 and also clocks the unload clock input of the FIFO 187 (see FIG. 9) which makes the next information byte available for decoding.

Case No. 2

In Case No. 2, the concatenated codeword P/N represents a truncated runlength of black pels, i.e., C=1 and the information byte is:
B=11111111.

The black truncation code is selected for output of the multiplexer 194. Again, outputs A and B are the same and the comparator output 196 is LOW. As in case No. 1, the color change is inhibited and signal for "252" on line 204 is loaded into the runlength counter 193 via the multiplexer 197.

Case No. 3

In this case, the A and B inputs to the comparator 195 are not equal and, therefore, the comparator output is HIGH. This enables the next color flip-flop 192 to change stage. On the leading edge of the LOAD signal, the current color is clocked into the current color flip-flop 202. On the trailing edge of the LOAD signal, the

TABLE II

| | | | Runlength/Color Decode | | |
|---|---|---|---|---|---|
| CASE | INPUT | CONDITIONS | RUNLENGTH | VALUE LOADED INTO RUN-LENGTH COUNTER | ACTION FOR NEXT RUNLENGTH |
| | Next* Color | Info. Byte B | | | |
| 1 | White C=0 | 00000010 | 253 | 252 | Inhibit Color Change |
| 2 | Black C=1 | 11111111 | 253 | 252 | Inhibit Color Change |
| 3 | C | B | B−2+C | B−3+C | Change Color |

Case No. 1

With specific reference to Case No. 1, where the information byte represents a runlength of 253 white pels, the output Q of the next color flip-flop 192 is white. This selects the white truncation code (00000010) for output at multiplexer 194. This output is connected to the input A of the comparator 195. The output of flip-flop 192 toggles and the color of the next runlength will be the opposite color of the current runlength. The HIGH output of the comparator selects the binary adder output on line 210 for the value to be loaded into the runlength counter 193 via multiplexer 197. This value is color dependent. If the color is white, the runlength (RL) is two less than the information byte B. That is:

$RL = B - 2$.

The actual value to be loaded into the runlength counter 193 is "B−3" (RLC herein), since the counter decrements from the loaded value to 0. If the color is black,
$RL = B - 1$.

This can be generalized as follows:

$RL = B - 2 + C$, $RLC = B - 3 + C$
$= B - (3 - C)$
where $C = 0$ for white
$C = 1$ for black The subtraction is accomplished by addition of the "TWO'S COMPLEMENT" to B. That is:

$RLC_2 = B_2 + [11 - C)_2 + 1]$,
where the subscript 2

-continued
indicates base 2 numbers.
For White, $RLC_2 = (11 - C)_2 + 1 = 11111101$
For Black, $RLC_2 = (11 - C)_2 + 1 = 11111110$ This can be expressed as $RLC_2 = B_2 + 111111CC$.

Thus, the information byte is modified by the color to load the correct value into the runlength counter.

The output 212 of the runlength counter 193 and the output 214 of the current color flip-flop 202 are introduced into the line memory module 165 which comprises a dual one-line memory 216 and a read/write controller 218 (see FIG. 9). The dual oneline memory 216 permits accumulation and storage of two complete pel-by-pel lines of data, whereby output of the decode logic need not be inhibited during a WRITE cycle, but instead, may be switched to an alternative memory. Upon accumulation of a line of data, the information is outputted to the transmit module 166, by which it is introduced to the output writing module 34 in serial, pel-to-pel form via the line 167.

TABLE III

Logic Tables for Encoder and Decoder Operation
A. Encoder

Sequence Control Logic of the Encoder
(State Transition)

| CURRENT STATE | CONDITION | ACTION | NEXT STATE |
|---|---|---|---|
| INITIALIZATION | RUN COMMAND | | INITIALIZATION SPEED TRANSIENT DELAY |
| SPEED TRANSIENT DELAY | STANDBY COMMAND DIGITIZER UP TO SPEED | SET READY FLAG TO | INITIALIZATION DIGITIZER RUNNING |
| DIGITIZER RUNNING | STANDBY COMMAND ARM ENCODER COMMAND | | INITIALIZATION LEAD EDGE DELAY |
| LEAD EDGE DELAY | STANDBY COMMAND LEAD EDGE DETECTED | CLEAR LOOP COUNTER, INITIALIZE RESIDUE | INITIALIZATION GAIN DELAY |
| GAIN DELAY | STANDBY COMMAND | SELECT GAIN DELAY LINE COUNT FOR COMPARISON, INCR. LOOP COUNTER AT BOL | INITIALIZATION |
| BASE LINE TEST | STANDBY COMMAND LOOP COUNTER = BASE LINE COUNT | SELECT BASE LINE COUNT FOR COMPARISON, INCR. LOOP COUNTER AT BOL | INITIALIZATION LINE LOOP BEGINNING |
| LINE LOOP BEGINNING | STANDBY COMMAND | STORE LINE COUNT, CLEAR LOOP COUNTER | INITIALIZATION BASE PEL TEST |
| BASE PEL TEST | STANDBY COMMAND LOOP COUNTER = BASE PEL NUMBER | SELECT BASE PEL NUMBER FOR COMPARISON, INCR. LOOP COUNTER AT DATA AVAILABLE, PRESET COLOR F-F's, ENABLE INPUT | INITIALIZATION ENCODE INPUT |
| ENCODE INPUT | STANDBY COMMAND | GROUP ONE ACTIONS: ENABLE INPUT, SELECT LIMIT PEL NUMBER FOR COMPARISON, INCR. LOOP COUNTER AT DATA AVAILABLE | INITIALIZATION |
| | CODEWORD READY | GROUP ONE | CODEWORD |

TABLE III-continued

Logic Tables for Encoder and Decoder Operation
A. Encoder

Sequence Control Logic of the Encoder
(State Transition)

| CURRENT STATE | CONDITION | ACTION | NEXT STATE |
|---|---|---|---|
| | | ACTIONS PLUS: LOAD CODEWORD REGISTER, PRESET RUN-LENGTH COUNTER | AVAILABLE |
| | LOOP COUNTER = LIMIT PEL NUMBER | GROUP ONE ACTIONS PLUS: LOAD CODEWORD REGISTER | FIRST HALF LINE SYNC. |
| CODEWORD AVAILABLE | STANDBY COMMAND | GROUP ONE ACTIONS PLUS: | INITIALIZATION |
| | CODEWORD NOT READY | ENABLE FIFO LOAD | ENCODE INPUT |
| | LOOP COUNTER = LIMIT PEL NUMBER | GROUP ONE ACTIONS PLUS: LOAD CODEWORD REGISTER, ENABLE FIFO LOAD | FIRST HALF LINE SYNC. CODEWORD AVAILABLE |
| FIRST HALF LINE SYNC. | STANDBY COMMAND | LOAD LOOP WITH STORED LINE COUNT, LOAD CODEWORD REGISTER, ENABLE FIFO LOAD SELECT FIRST HALF OF LINE SYNC. AT CODEWORD MAX. | INITIALIZATION |
| SECOND HALF LINE SYNC. | STANDBY COMMAND | INCR. LOOP COUNTER, LOAD CODEWORD REGISTER, ENABLE FIFO LOAD, SELECT SECOND HALF LINE SYNC. AT CODEWORD MAX. | INITIALIZATION LINE COUNT TEST |
| LINE COUNT TEST | STANDBY COMMAND | SELECT LIMIT LINE COUNT FOR COMPARISON, ENABLE FIFO LOAD | INITIALIZATION |
| | LOOP COUNTER = LIMIT LINE COUNT | | LINE LOOP BEGINNING |
| | LOOP COUNTER = LIMIT LINE COUNT | LOAD CODE WORD REGISTER, SELECT FIRST HALF LINE SYNC. AT CODEWORD MAX. ENABLE FIFO LOAD | FIRST HALF END OF PAGE |
| FIRST HALF END OF PAGE | STANDBY COMMAND | LOAD CODEWORD REGISTER, SELECT SECOND HALF LINE SYNC. AT CODEWORD MAX. ENABLE FIFO LOAD | INITIALIZATION SECOND HALF END OF PAGE |
| SECOND HALF PIPELINE CLEAR | STANDBY COMMAND | ENABLE FIFO LOAD | INITIALIZATION PIPELINE CLEAR |
| | STANDBY COMMAND FIFO AND RESIDUE EMPTY | SET PAGE READY, SET INTERRUPT TO PROCESSOR | INITIALIZATION DIGITIZER RUNNING |

TABLE IV

Number Represented by 3-bit Control Field to 14-bit Left Shift Logic

½ NUMBER OF BITS ACCUMULATED IN RESIDUE REGISTER

|  | 0 | 1 | 2 | 3 | 4 | 5 | 6 | 7 |
|---|---|---|---|---|---|---|---|---|
| ½ NUMBER OF BITS IN NEXT CODEWORD  1 | 1 | 6 | 5 | 4 | 3 | 2 | 1 | 0 | * |
| 2 | 2 | 5 | 4 | 3 | 2 | 1 | 0 | * | 6 |
| 3 | 3 | 4 | 3 | 2 | 1 | 0 | * | 6 | 5 |
| 4 | 4 | 3 | 2 | 1 | 0 | * | 6 | 5 | 4 |
| 5 | 5 | 2 | 1 | 0 | * | 6 | 5 | 4 | 3 |
| 6 | 6 | 1 | 0 | * | 6 | 5 | 4 | 3 | 2 |
| 7 | 7 | 0 | * | 6 | 5 | 4 | 3 | 2 | 1 |

* = "Do Not Care"

TABLE V

Number Represented by 3-bit Control Field to 16-bit Right Shift Logic

½ NUMBER OF BITS ACCUMULATED IN RESIDUE REGISTER

|  | 0 | 1 | 2 | 3 | 4 | 5 | 6 | 7 |
|---|---|---|---|---|---|---|---|---|
| ½ NUMBER OF BITS IN NEXT CODEWORD  1 | * | * | * | * | * | * | * | 1 |
| 2 | * | * | * | * | * | * | 1 | 2 |
| 3 | * | * | * | * | * | 1 | 2 | 3 |
| 4 | * | * | * | * | 1 | 2 | 3 | 4 |
| 5 | * | * | * | 1 | 2 | 3 | 4 | 5 |
| 6 | * | * | 1 | 2 | 3 | 4 | 5 | 6 |
| 7 | * | 1 | 2 | 3 | 4 | 5 | 6 | 7 |

* = "Do Not Care".

TABLE VI

Read State For Controller
B. Decoder

| CURRENT STATE | CONDITION | ACTION | NEXT STATE |
|---|---|---|---|
| PWR ON/RESET 000 | MCLR = 1 | RESET TO INITIAL STAGE | 000 |
|  | MCLR = 0 |  | 001 |
| READ BUFFER EMPTY 001 | SWITCH = 0 | RBE = 1 | 001 |
|  | SWITCH = 1 |  | 010 |
| FILL S-P REG 010 | FULL = 0 | SHIFT COLOR BIT INTO S-P REGISTER DECREMENT MEMORY READ ADDRESS COUNTER | 010 |
|  | FULL = 1 |  | 011 |
| WAIT FOR DATA REQ 011 | FIFO DATA REQUEST (FDR)=0 |  | 011 |
|  | FDR = 1 |  | 100 |
| LOAD DATA 100 | ZERO = 0 (NOT FINISHED READING LINE) | LOAD UNCOMPRESSED DATA CATCH WITH 16 BIT PARALLEL WORD. GENERATE LOAD DATA PULSE TO FIFO | 010 |
|  | ZERO = 1 (FINISHED READING LINE) |  | 000 |

TABLE VII

Read/Write Controller of Line Memory

| CURRENT STATE | CONDITION | ACTION | NEXT STATE |
|---|---|---|---|
| 00 | MCLR=1 | RESET TO INITIAL CONDITIONS | 00 |
|  | MCLR=0 | X BUFFER & WRITE Y BUFFER & READ SWITCH=0 | 00 |
|  | RBE·WBF=1 READ BUFFER EMPTY·WRITE BUFFER FULL | X=READ Y=WRITE | 11 |
| 11 | RBE·WBF=1 | SWITCH = 1 | 10 |
|  | RBE·WBF=0 |  | 11 |
| 10 | RBE·WBF=0 | SWITCH = 0 | 10 |
|  | RBE·WBF=1 | X=WRITE Y=READ | 01 |
| 01 | RBE·WBF=0 | SWITCH = 1 | 01 |
|  | RBE·WBF=1 |  | 00 |

TABLE VIII

Write State For CONTROLLER

| CURRENT STATE | CONDITION | ACTION | NEXT STATE |
|---|---|---|---|
| PWR ON/RESET 0 | MCLR = 1 | RESET TO INITIAL STARTING CONDITIONS | 0 |
|  | MCLR = 0 |  | 1 |
| IDLE 1 | FIFO OUTPUT READY & LINE SYNC (LS) RESET & END-OF-LINE (EOL) RESET |  | 2 |
|  | LS·EOL = 1 |  | 7 |
|  | LS·EOL = 1 |  | 6 |

TABLE VIII-continued

Write State For CONTROLLER

| CURRENT STATE | CONDITION | ACTION | NEXT STATE |
|---|---|---|---|
|  | LS · EOL = 1 |  | 5 |
| LOAD RUN LENGTH 2 |  | LOAD RUNLENGTH COUNTER, UPDATE COLOR, UNLOAD INFORMATION BYTE FOR CURRENT RUNLENGTH FROM FIFO | 3 |
|  | CONCATENATION CODE (CHG/INH=0) | RUNLENGTH COUNTER=252, INHIBIT COLOR CHANGE ON NEXT CODEWORD |  |
|  | NON-CONCATENATION CODE (CHG/INH=1) | RUNLENGTH COUNTER = IB-3:C |  |
| COUNT RUNLENGTH 3 | RLTC + EOL = 0 | DECREMENT RUNLENGTH COUNTER, INCREMENT WRITE ADDRESS COUNTER, WRITE CURRENT COLOR INTO MEMORY LOCATION SPECIFIED BY MEMORY ADDRESS COUNTER | 3 |
|  | RLTC + EOL = 1 |  | 1 |
| INVALID STATE 4 |  |  | 5 |
| LINE SYNC LATE 5 | OR=1, LS=0, EOL=1 | WAIT FOR OR=0 DEC. ERR SET | 5 |
|  | OR=0, LS=0, EOL=1 | GENERATE UNLOAD CLOCK TO FIFO DEC. ERR SET | 5 |
|  | LS=1 | DEC. ERR SET | 7 |
| LINE SYNC EARLY 6 | EOL=0 | FORCE COLOR TO WHITE, INCREMENT MEMORY ADDRESS COUNTER. WRITE COLOR INTO MEMORY. SET DEC. ERROR | 6 |
|  | EOL=1 |  | 7 |
| EXIT 7 | SWITCH=0 |  | 7 |
|  | SWITCH=1 | UNLOAD LINE SYNC FLAG | 0 |

TABLE IX

CONTROL LOGIC - COMPARATOR

| CURRENT STATE | CONDITION | ACTION | NEXT STATE |
|---|---|---|---|
| 0 PWR ON/RESET | MASTER CLEAR=1 | INITIALIZE DECODER TO KNOWN STARTING CONDITIONS NOTE: WHENEVER MCLR=1 THE DECODER ENTERS THIS STATE, REGARDLESS OF PRESENT STATE. | PLURON/RESET 0 |
|  | MCLR=0 |  | INITIALIZE FRAME SHFT COUNTER & BIT SHIFT COUNTER 1 |
| 1 INITIALIZE FRAME SHIFT COUNTER & BIT SHIFT COUNTER | PSFLG=0 | PRESET FC=7 BC=7 | WAIT FOR DATA 2 |
|  | PSFLG=1 |  | 1 |
| 2 WAIT FOR DATA | DATA READY=0 (NOT READY) | SET DATA REQUEST TO CDMC | 2 |
|  | DATA READY=1 (READY) |  | 3 |
| 3 LOAD DATA | FRAME TERMINAL COUNT (FTC)=0 | LOAD DATA INTO BITS 0-15 OF 32 | 4 |

TABLE IX-continued

| CURRENT STATE | CONTROL LOGIC - COMPARATOR | | NEXT STATE |
| --- | --- | --- | --- |
| | CONDITION | ACTION | |
| | CODE WORD NOT "FRAMED". | BIT SHIFT/STORAGE REGISTER. SINCE CODEWORDS ALWAYS HAVE EVEN NUMBER OF BITS, CODEWORDS ARE SEPARATED INTO EVEN & ODD BITS. THIS ALLOWS EACH CLOCK CYCLE TO SHIFT 2 BITS, EFFECTIVELY DOUBLING SHIFTING SPEED WITH A COMMENSURATE INCREASE IN DECODING SPEED | |
| 3 SHIFT MODE 4 | FTC=1 | LOAD DATA | 5 |
| | FTC=0 BTC=0 | SHIFT 2 BITS (ONE ODD, ONE EVEN) INCREMENT FRAME SHIFT COUNT, INCREMENT BIT SHIFT COUNT | 4 |
| | FTC=1, BTC=0 | DISABLE SHIFTING AND INCREMENTING OF COUNTERS | 5 |
| | FTC=1ORO, BTC=1 | DISABLE SHIFTING AND INCREMENTING OF COUNTERS, RELOAD BIT SHIFT COUNTER WITH 7 | 2 |
| 5 FRAME READY | LINE SYNC | DECODE PREFIX (P), SCALE FACTOR, FRAME SHIFT COUNTER, PRESET. | 6 9 |
| 6 ENABLE FC LOAD | | PRESET FRAME SHIFT COUNTER TO 14-P. CLEAR LINE SYNC FLAG | 7 |
| 7 FC LOADED WAITING | INPUT READY (IR) =1 FOR SPACE AT FIFO INPUT | | 7 |
| | IR=0 | | 8 |
| 8 LOAD FIFO INPUT | | GENERATE FIFO LOAD CLOCK | 4 |
| 9 END OF LINE OR PAGE | LSFLG (LINE SYNC FLAG)=0 LAST CODEWORD WAS NOT A LINE SYNC CODE. | | 10 |
| | LSFLG=1, PSFLG (PAGE SYNC FLAG)=0 TWO LINE SYNCS IN A ROW - PAGE SYNC CODE. | SET PAGE SYNC FLAG | 1 |
| 10 ENABLE LINE SYNC | | SET LSFLG=1 SELECT FRAME SHIFT COUNTER PRESET=1 | 7 |

What is claimed is:

1. A method of one-dimensional redundancy reduction coding, transmission and decoding of binary image data by use of an entropy preserving algorithm, the image data of the type including two-level pel representation of an image to be transmitted, comprising the steps of:

(a) generating an image definition comprising a serial stream of binary data bits, each bit representing a single pel of either a first level or a second level;
(b) assigning a predetermined binary code N having a number of data bits n representing a runlength of consecutive pels of a single level;
(c) assigning a prefix P for defining with N a codeword representation of a runlength, the prefix P having a number of data bits p, whereby the total number of data bits representing each runlength of pels is defined by a codeword comprising a prefix P and a code N having (p+n) data bits;
(d) concatenating consecutive codewords;
(e) framing the concatenated codewords into output words W each having a fixed, predetermined number of data bits w;
(f) transmitting the output words; and
(g) receiving and decoding the transmitted output words for generating therefrom a serial stream of data bits, each bit representing a single pel of one of said levels, by searching in said output words for the prefix P associated with a codeword and identifying therefrom the (p+n) bits associated therewith.

2. The method of claim 1, wherein the step of concatenating consecutive codewords comprises:
(a) framing the first w bits of a first group of consecutive codewords to define an output word;
(b) preserving any residue bits r in said first group of consecutive codewords in excess of the first w bits; and
(c) framing said residue bits with the first (w−r) bits of a second group of consecutive codewords to define another output word.

3. The method of claim 2, wherein the step of decoding the transmitted output words comprises:
(a) identifying a codeword comprising (p+n) bits in the output words; and
(b) generating a corresponding serial stream of binary bits, each bit representing a single pel in a runlength of pels of one of said two levels.

4. The method of claim 3, wherein the steps of decoding the transmitted output words further comprises:
(a) locating the prefix P associated with each codeword in said output words;
(b) framing the (p+n) bits defined by the prefix P and associated with the corresponding codeword; and
(c) generating the corresponding serial stream of binary data bits defined by the n bits identifying the code N in said (p+n) bits.

5. The method of claim 1, wherein w is an arbitrary number.

6. The method of claim 1, wherein p is proportional to n.

7. The method of claim 6 where n is an arbitrary number of from two to n bits and wherein p is equal to the quantity (n−2).

8. The method of claim 1 wherein the first runlength of each data image is arbitrarily defined as a runlength of a predetermined one of said pel levels.

9. The method of claim 8, wherein each code N represents runlengths of either of said pel levels.

10. The method of claim 9, including the steps of setting an arbitrary limit on the consecutive number of pels of one level in a runlength, defined by a single codeword and assigning a unique code to a runlength having a number of pels in excess of the limit for indicating that the runlength of pels is defined by a plurality of consecutive codewords defining consecutive runlengths of the same pel level.

11. The method of claim 1, wherein the binary image data is generated by a raster scan device adapted for optically scanning an image on a sheet document.

12. The method of claim 11, wherein the scanner defines the image as a plurality of pels for each line of scan and wherein the first runlength of each line is arbitrarily defined as a runlength of a predetermined one of said pel levels.

13. The method of claim 11, including the step of defining on the sheet document a predetermined image area to be scanned.

14. An apparatus for one-dimensional redundancy reduction coding, transmitting and decoding binary data by use of an entropy preserving algorithm, the data representing an image in a plurality of two-level pels, comprising:
(a) means for generating an image definition comprising a serial stream of binary data bits, each bit representing a single pel of either a first level or a second level;
(b) means for defining the boundaries between runs of consecutive pels of the same level by using an entropy preserving algorithm, wherein there is further:
(i) means for assigning a predetermined binary code N having a number of data bits n representing a runlength of consecutive pels of a single level;
(ii) means for assigning a prefix P for defining with N a codeword representation of a runlength, the prefix P having a number of data bits p, whereby the total number of data bits representing each runlength of pels is defined by a codeword comprising a prefix P and a code N having (p+n) data bits;
(c) means dependent on said boundaries for generating a binary codeword representing each of said runs;
(d) means for concatenating the first w bits of a first group of consecutive codewords to define an output word;
(e) means for separating and storing any residue bits r in the first group of codewords in excess of w bits;
(f) means for defining another output word from the next subsequent group of codewords by concatenating the first (w−r) bits of said group with the residue bits r of the first group of codewords;
(g) means for transmitting the output words; and
(h) means for extracting the codewords from said output words for reformation of the image in pel-to-pel format.

15. The apparatus of claim 14, wherein the output words include a predetermined, arbitrary number of data bits w, wherein the codewords contain from 2 to n bits, and wherein w is not required to be a whole number multiple of n.

16. The apparatus of claim 15, further including:
(a) means for concatenating the first w bits of a first group of consecutive codewords to define an output word;
(b) means for separating and storing any residue bits r in the first group of codewords in excess of w bits; and
(c) means for defining another output word from the next subsequent group of codewords by concatenating the first (w−r) bits of said group with the residue bits r of the first group of codewords.

17. The apparatus of claim 15, the means for decoding further comprising means for extracting whole codewords from one or more output words.

18. The apparatus of claim 14 wherein the means for generating an image definition comprises a raster scanner for optically scanning an image on a sheet document.

* * * * *